(12) United States Patent
Morrow et al.

(10) Patent No.: US 11,038,527 B1
(45) Date of Patent: Jun. 15, 2021

(54) ELECTRONIC DEVICE AND METHOD FOR COMPRESSING SAMPLED DATA

(71) Applicant: HONEYWELL FEDERAL MANUFACTURING & TECHNOLOGIES, LLC, Kansas City, MO (US)

(72) Inventors: Mitchell Hedges Morrow, Overland Park, KS (US); Michael Aaron Tohlen, Raymore, MO (US); William Oliver Craig, Independence, MO (US); John Savage, Kansas City, MO (US)

(73) Assignee: Honeywell Federal Manufacturing & Technologies, LLC, Kansas City, MO (US)

(*) Notice: Subject to any disclaimer, the term of this patent is extended or adjusted under 35 U.S.C. 154(b) by 33 days.

(21) Appl. No.: 16/862,806

(22) Filed: Apr. 30, 2020

Related U.S. Application Data

(63) Continuation-in-part of application No. 16/554,757, filed on Aug. 29, 2019, now abandoned, which is a continuation of application No. 16/150,355, filed on Oct. 3, 2018, now Pat. No. 10,447,297.

(51) Int. Cl.
*H03M 7/30* (2006.01)
*G06F 3/06* (2006.01)

(52) U.S. Cl.
CPC ........ *H03M 7/6058* (2013.01); *G06F 3/0608* (2013.01); *G06F 3/0661* (2013.01); *G06F 3/0673* (2013.01)

(58) Field of Classification Search
CPC .. H03M 7/6058; H03M 1/1205; H03M 1/122; G06F 3/0608; G06F 3/0673; G06F 3/0661
USPC .......................................... 341/87, 141, 155
See application file for complete search history.

(56) References Cited

U.S. PATENT DOCUMENTS 7,522,074 B2 * 4/2009 Wegener ............... G10L 19/002
341/155
8,508,397 B2 * 8/2013 Hisch .................... H03M 1/188
341/155

* cited by examiner

*Primary Examiner* — Khai M Nguyen
(74) *Attorney, Agent, or Firm* — Hovey Williams LLP

(57) ABSTRACT

An electronic device for compressing sampled data comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

20 Claims, 12 Drawing Sheets

INPUT AMPLITUDE

| 0 | S0 |
|---|---|
| 1 | S1 |
| 2 | S2 |
| ⋮ | ⋮ |
| n-1 | Sn-1 |

INPUT TIME

| 0 | t0 |
|---|---|
| 1 | t1 |
| 2 | t2 |
| ⋮ | ⋮ |
| n-1 | tn-1 |

FIG. 5

DIFFERENCE

| 0 | \| S1 - S0 \| |
|---|---|
| 1 | \| S2 - S1 \| |
| 2 | \| S3 - S2 \| |
| ⋮ | ⋮ |
| n-2 | \| Sn-1 - Sn-2 \| |

FIG. 6

OUTPUT AMPLITUDE

| 0 | S0 |
|---|---|
| 1 | S1 |
| 2 | S4 |
| ⋮ | ⋮ |
| n-1 | S20 |

OUTPUT TIME

| 0 | t0 |
|---|---|
| 1 | t1 |
| 2 | t4 |
| ⋮ | ⋮ |
| n-1 | t20 |

FIG. 7

ELECTRONIC DEVICE AND METHOD FOR COMPRESSING SAMPLED DATA

RELATED APPLICATION

The current patent application is a continuation in part patent application which claims priority benefit, with regard to all common subject matter, to U.S. patent application Ser. No. 16/554,757, entitled "ELECTRONIC DEVICE AND METHOD FOR COMPRESSING SAMPLED DATA", and filed Aug. 29, 2019, which is a continuation patent application that claims priority benefit, with regard to all common subject matter, to U.S. patent application Ser. No. 16/150,355, now U.S. Pat. No. 10,447,297, entitled "ELECTRONIC DEVICE AND METHOD FOR COMPRESSING SAMPLED DATA", and filed Oct. 3, 2018. The listed earlier-filed patent applications are hereby incorporated by reference, in their entireties, into the current patent application.

STATEMENT REGARDING FEDERALLY-SPONSORED RESEARCH OR DEVELOPMENT

This invention was made with Government support under Contract No.: DE-NA-00002839 awarded by the United States Department of Energy/National Nuclear Security Administration. The Government has certain rights in the invention.

BACKGROUND OF THE INVENTION

Field of the Invention

Embodiments of the current invention relate to electronic devices and methods for compressing sampled data.

Description of the Related Art

Capturing and recording a value of a signal or waveform at regular time intervals, a process known as "sampling", often results in large amounts of sampled data. Sampled data may be captured from, or come in the form of, audio signals, video signals, sensor data, and the like. Typically, it is desirable to compress, or reduce, the sampled data before storing or transmitting it so that the sampled data takes up less storage space, requires less communication bandwidth to transmit, or results in a shorter transmission time. Data compression techniques, such as aperture sampling, may reduce the sampled data by capturing significant changes in a signal or waveform's point-to-point amplitude. However, these techniques might not provide sufficient compression of the ever-increasing amount of media content generated by ubiquitous electronic devices and other sources. The result is a greater than necessary amount of storage space being consumed and increased requirements of bandwidth and transmission time.

SUMMARY OF THE INVENTION

Embodiments of the current invention solve the above-mentioned problems and provide a distinct advance in the art of compressing sampled data. In one embodiment, the current invention provides an electronic device configured to analyze a plurality of slopes, or first derivative, of the signal or waveform—resulting in an increase of the compression of sampled data. The electronic device broadly comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

In another embodiment, the current invention provides a electronic device for compressing sampled data. The electronic device broadly comprises a memory element and a processing element. The memory element is configured to store sampled data points and sampled times. The processing element is in electronic communication with the memory element and is configured to receive a plurality of sampled data points and a plurality of sampled times, each sampled data point associated with a successive one of the sampled times, calculate a plurality of differences, each difference being a magnitude of a change between successive adjacent pairs of sampled data points, calculate a plurality of difference changes, each difference change being a magnitude of a change between successive adjacent pairs of differences, compare each difference change to a threshold, and for each difference change that is greater than the threshold, store in the memory element one sampled data point associated with the difference change.

In yet another embodiment, the current invention provides a computer-implemented method for compressing sampled data. The method comprises receiving a plurality of sampled data points and a plurality of sampled times, each sampled data point associated with a successive one of the sampled times; calculating a plurality of differences, each difference being a magnitude of a change between successive adjacent pairs of sampled data points; calculating a plurality of difference changes, each difference change being a magnitude of a change between successive adjacent pairs of differences; comparing each difference change to a threshold; and for each difference change that is greater than the threshold, storing in the memory element one sampled data point associated with the difference change.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 2:
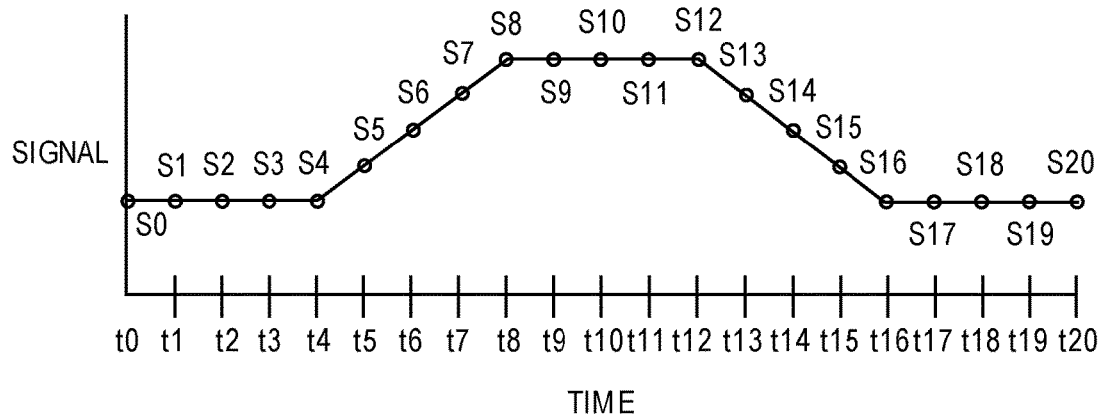
FIG. 2 is a plot of a signal vs. time, the plot including a plurality of sampled data points and sampled times.
Figure 4A:
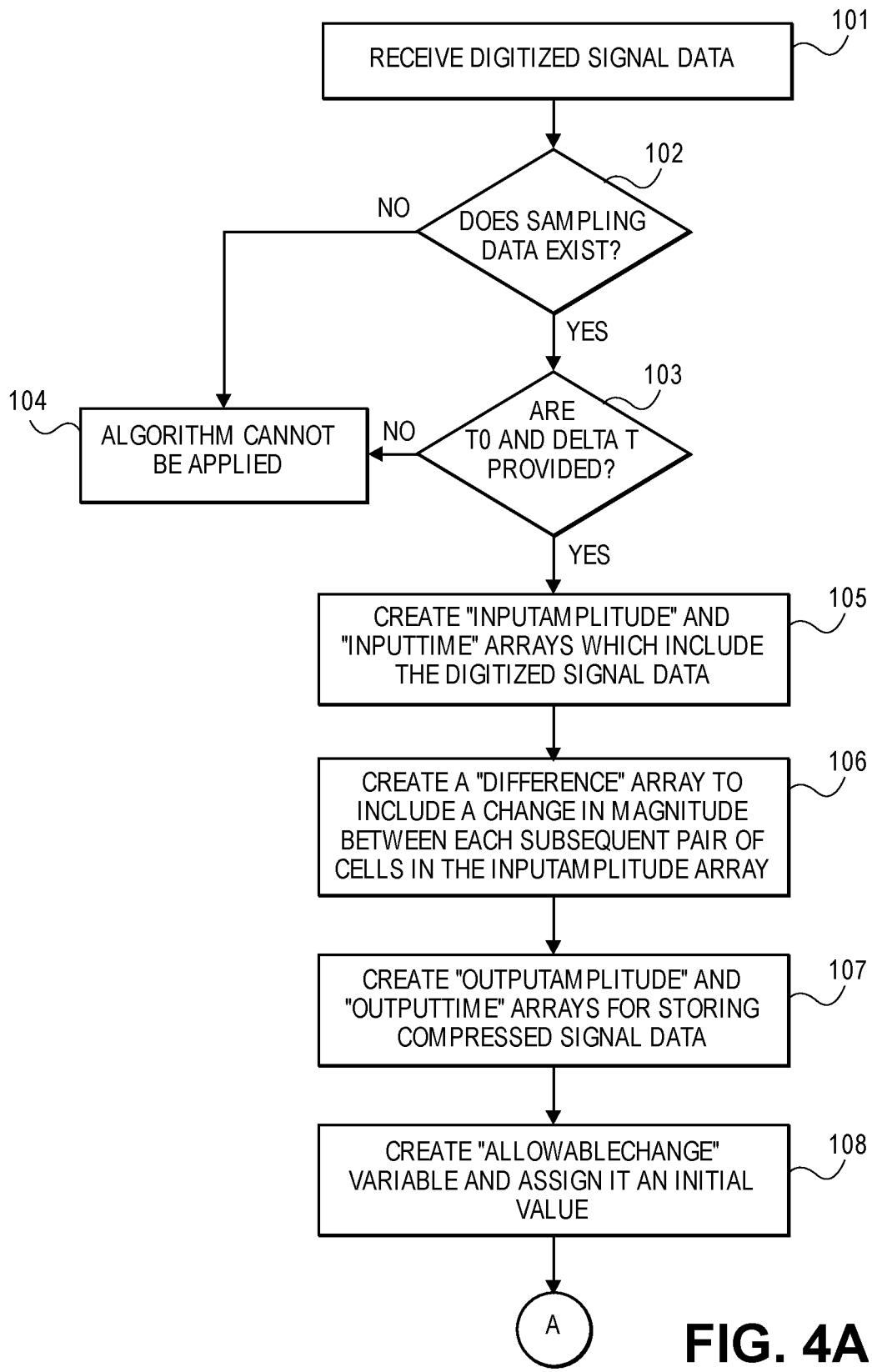
Figure 4B:
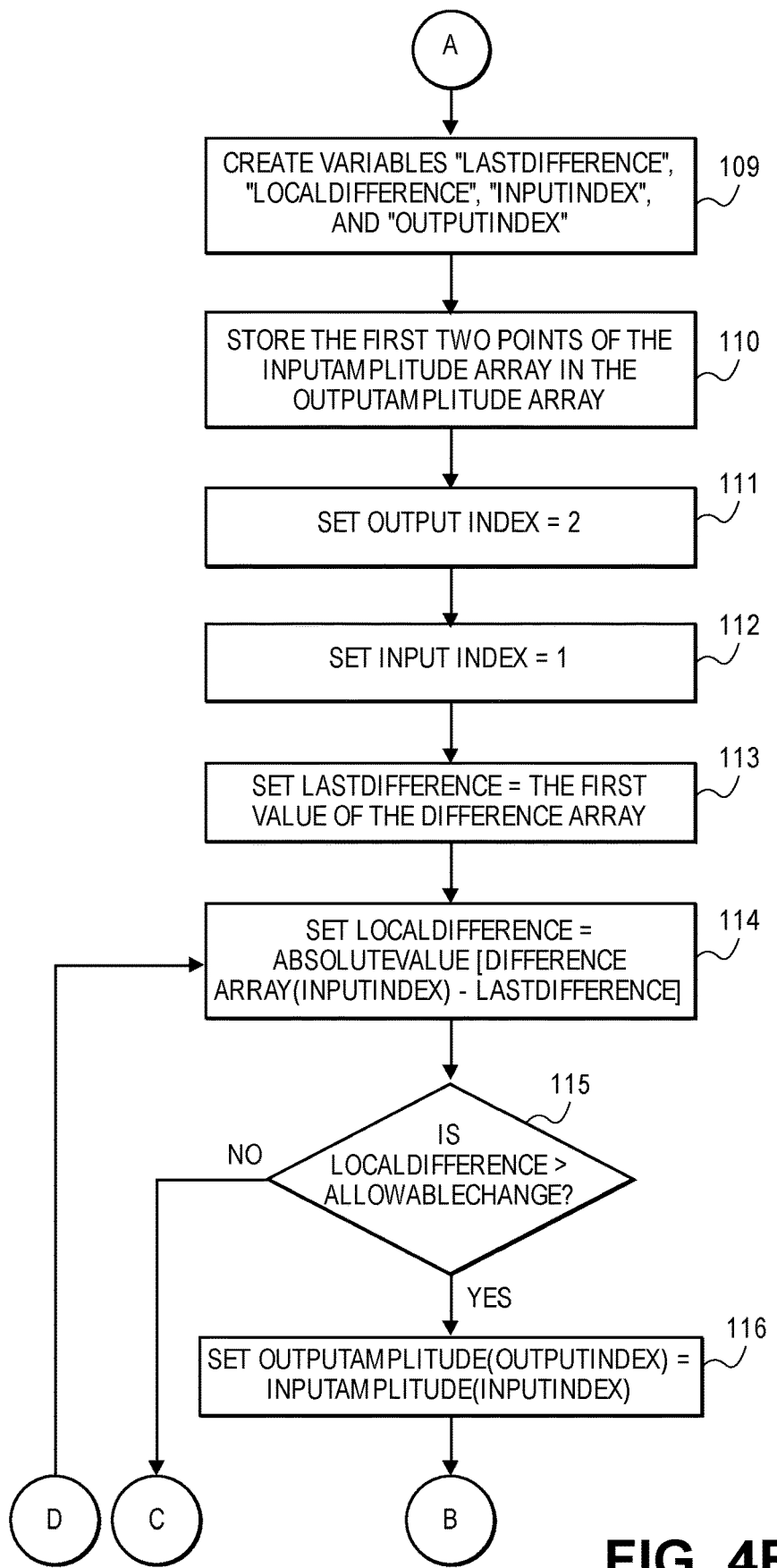
Figure 4C:
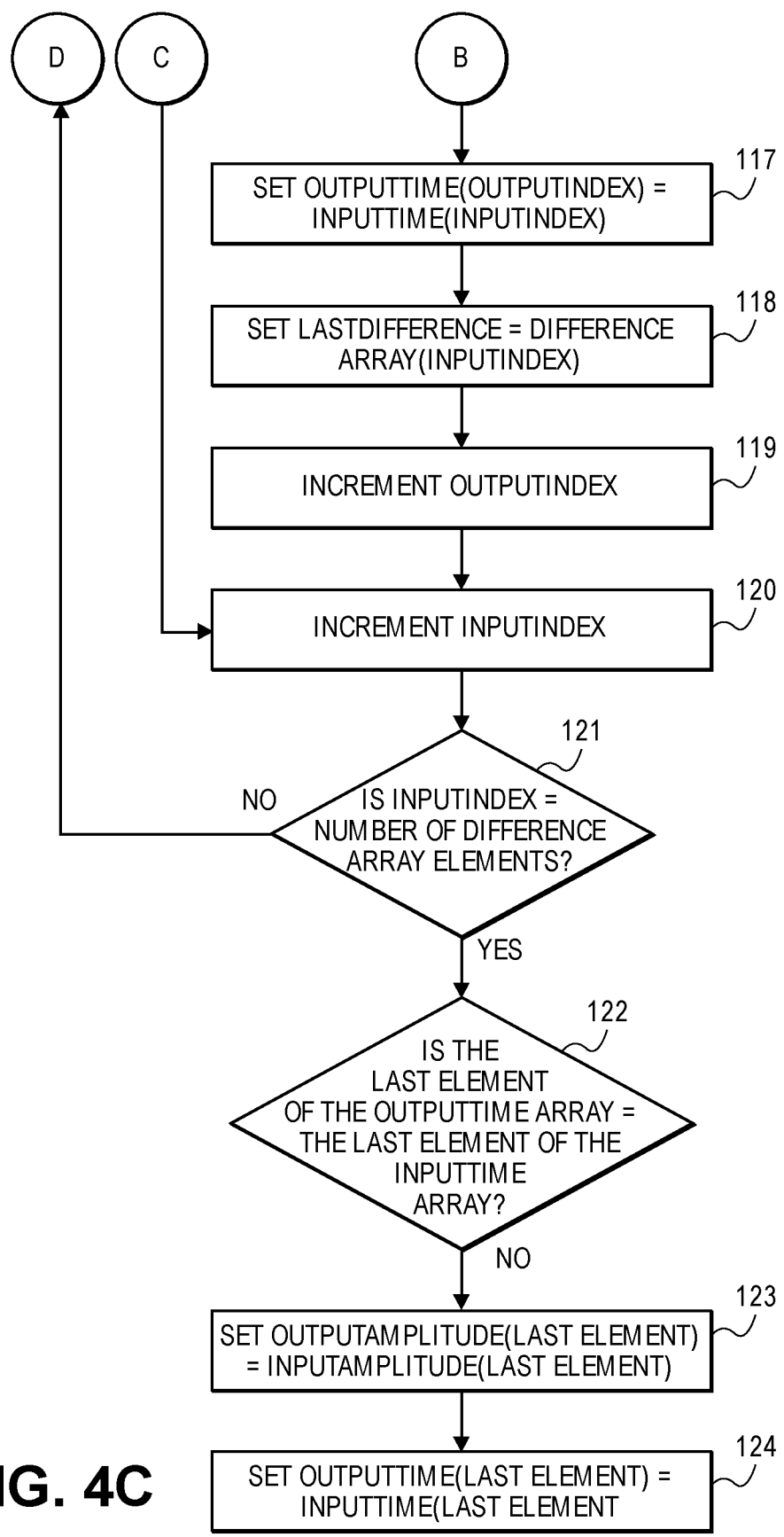
Figure 8:
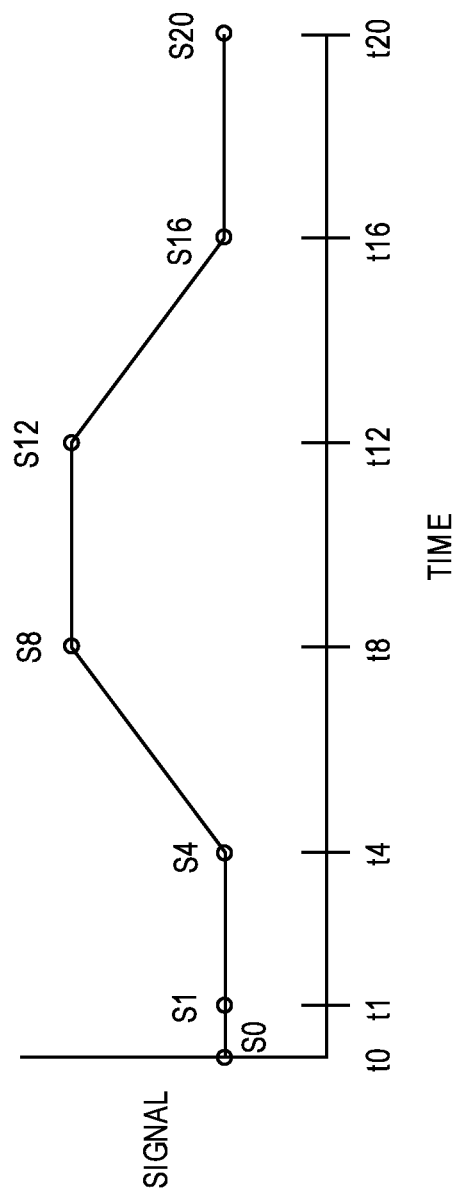
Figure 9:
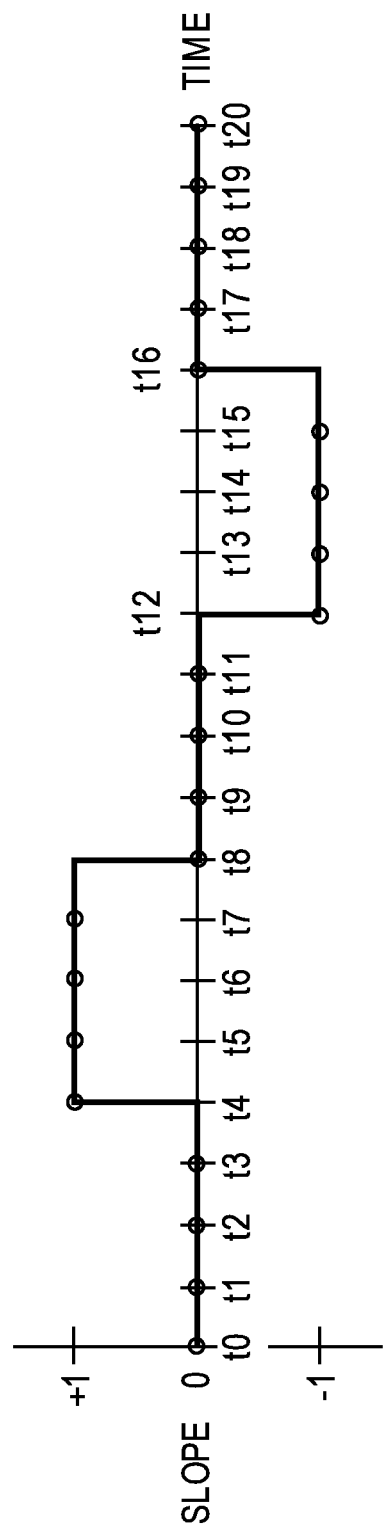
Figure 10:
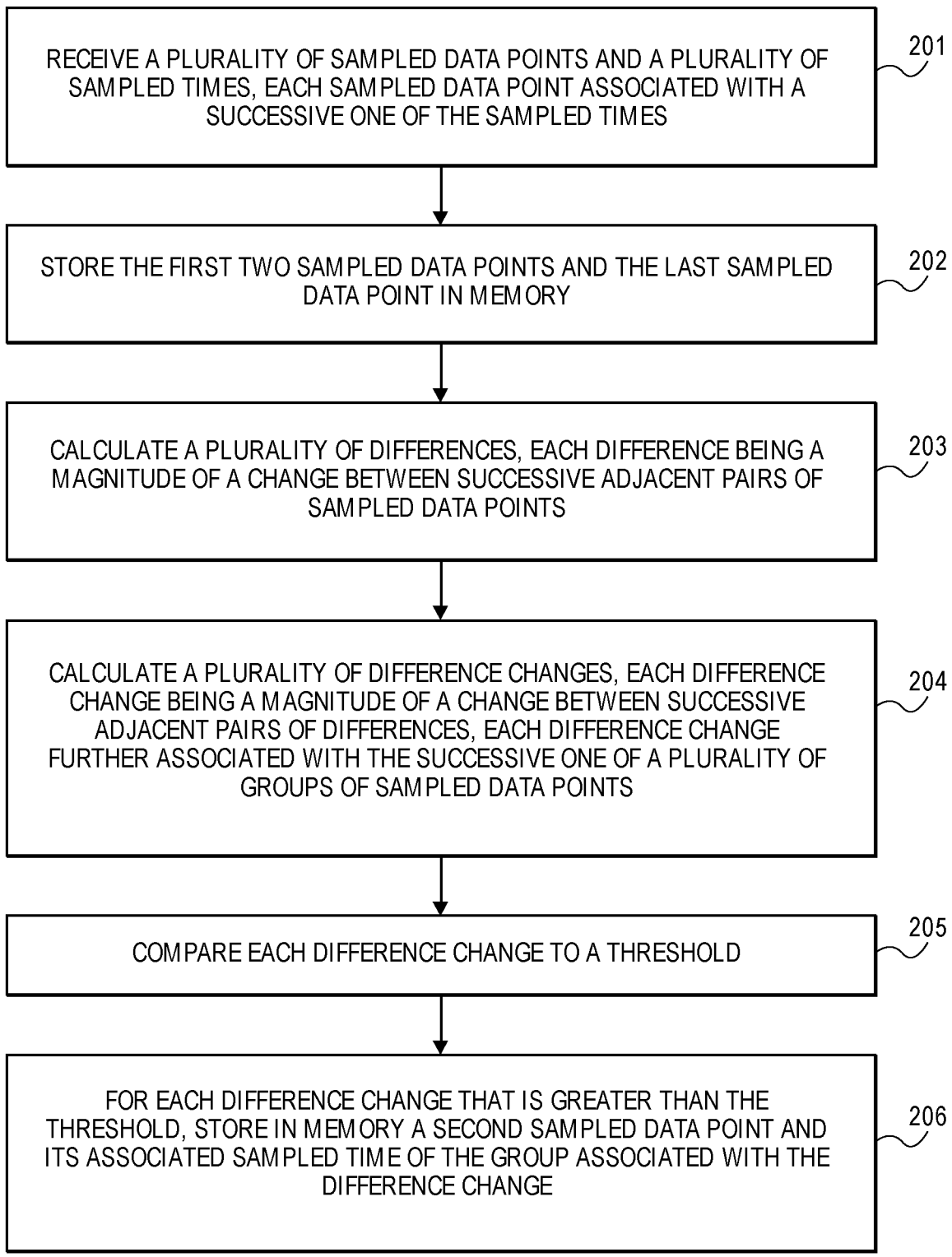
Figure 11:
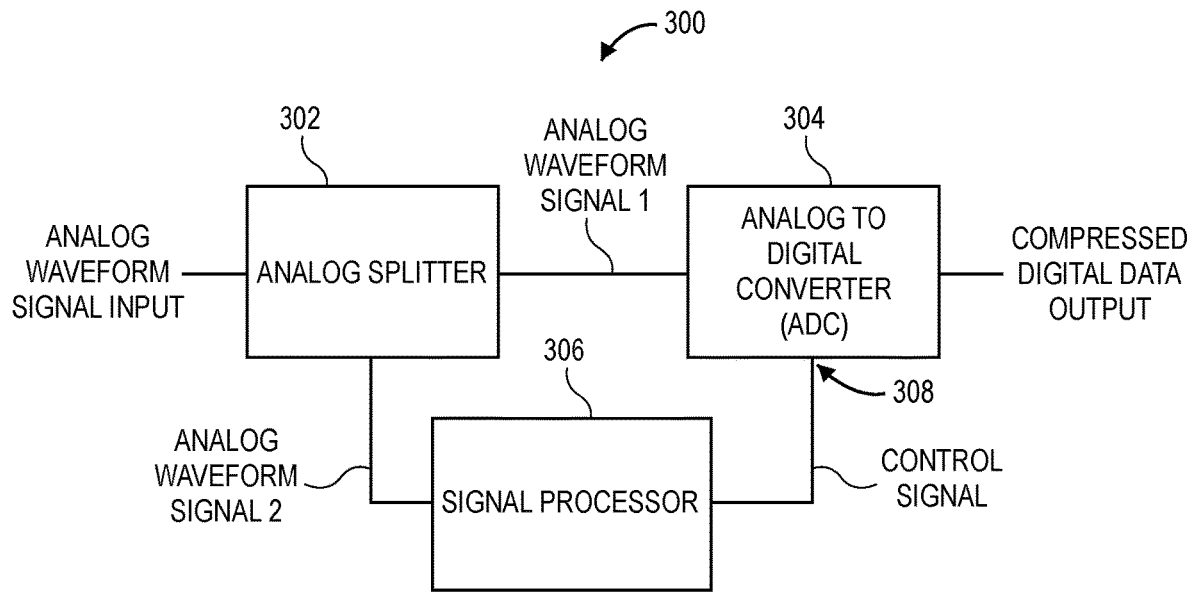
Figure 12:
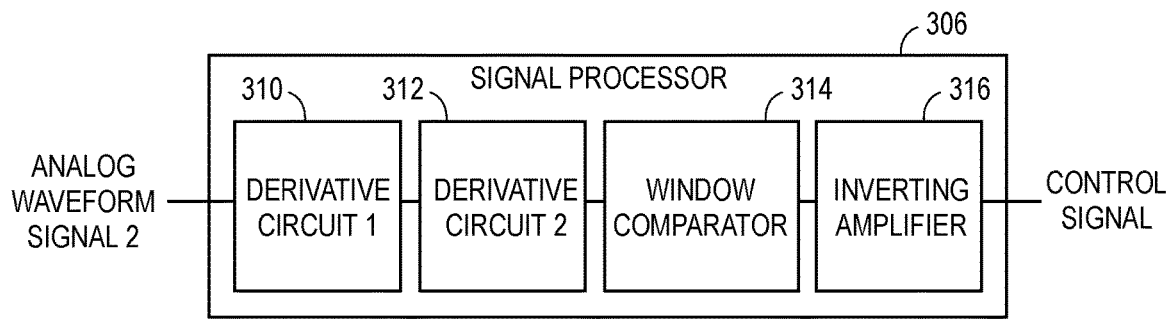
Figure 13:
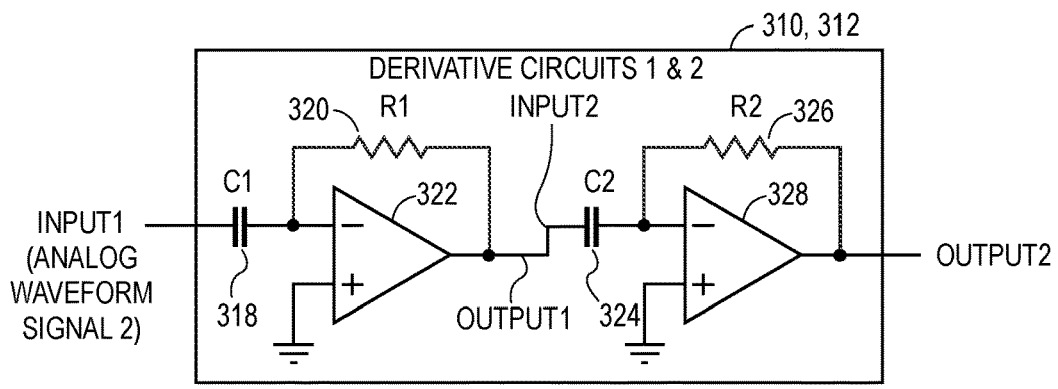
Figure 14:
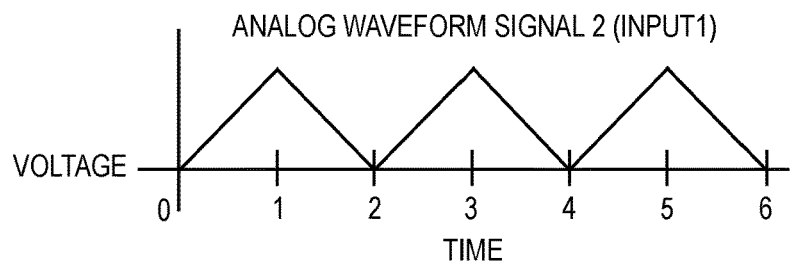
Figure 15:
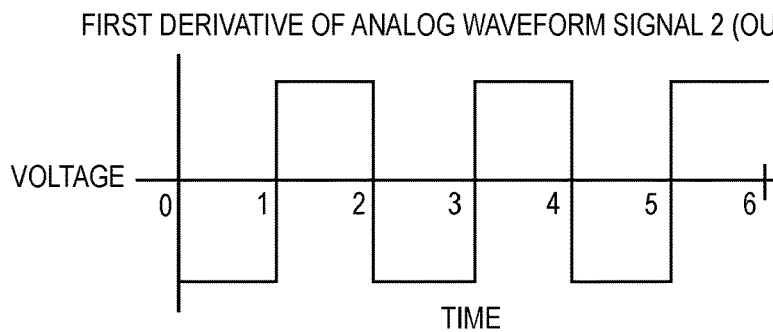
Figure 16:
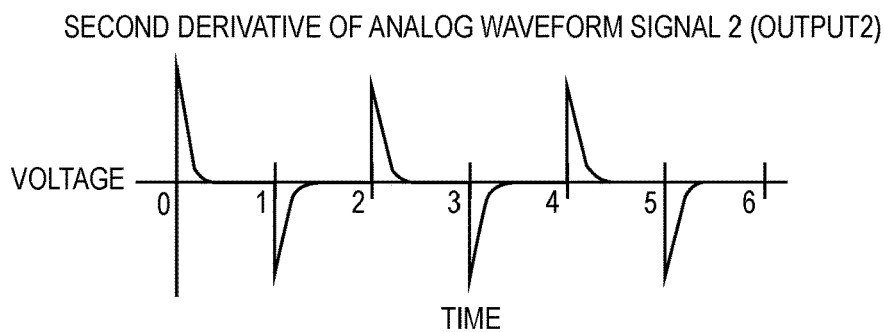
Figure 17:
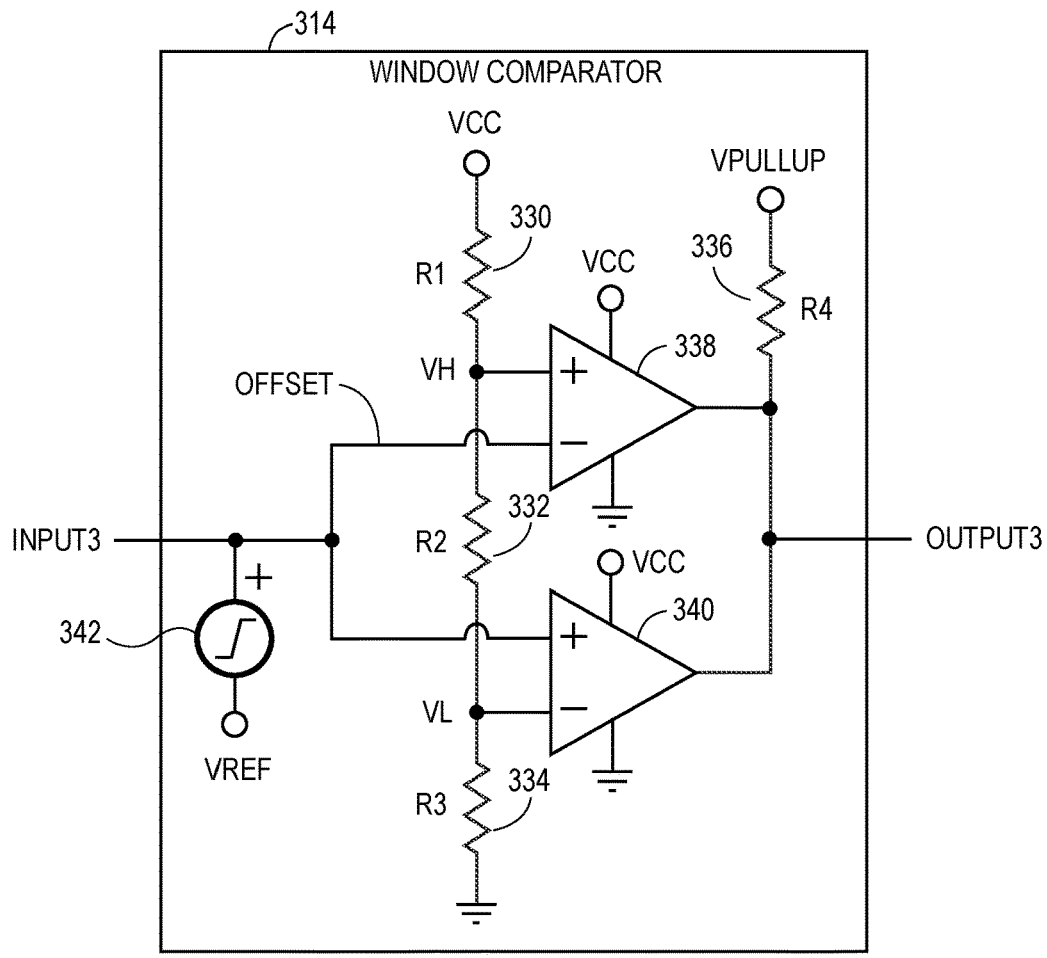
Figure 18:
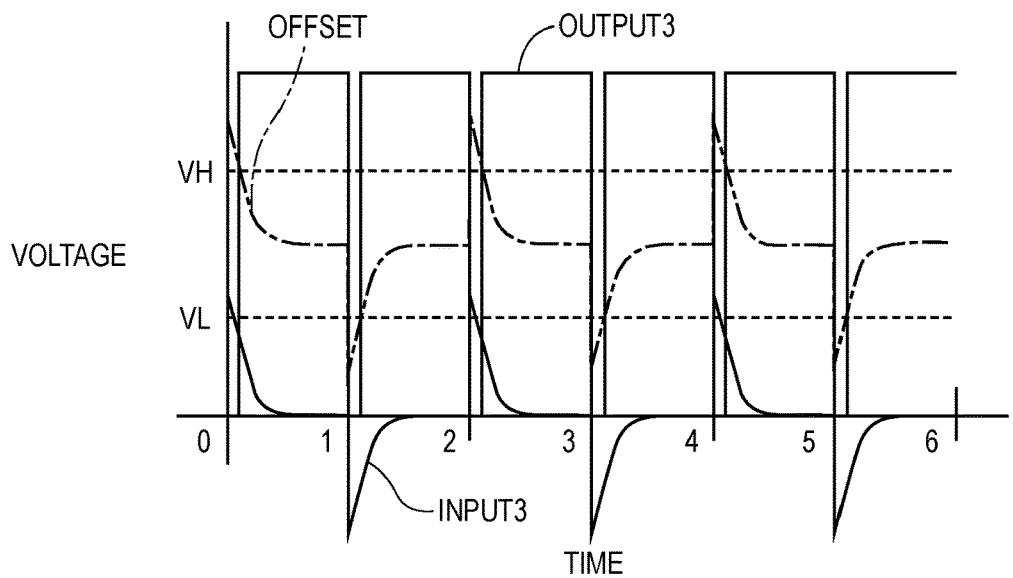
Figure 19:
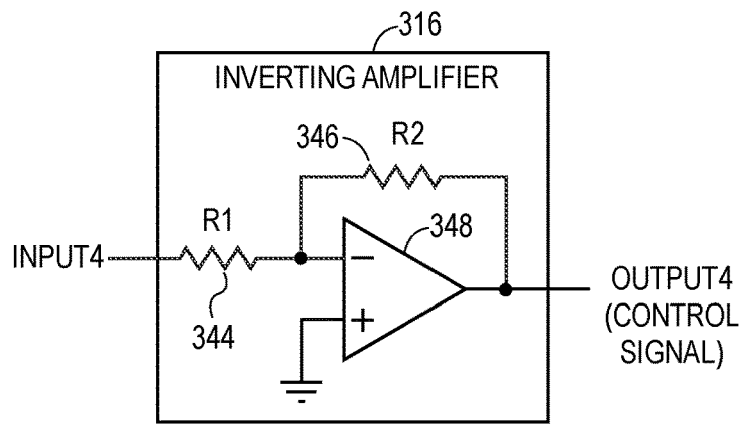
Figure 20:
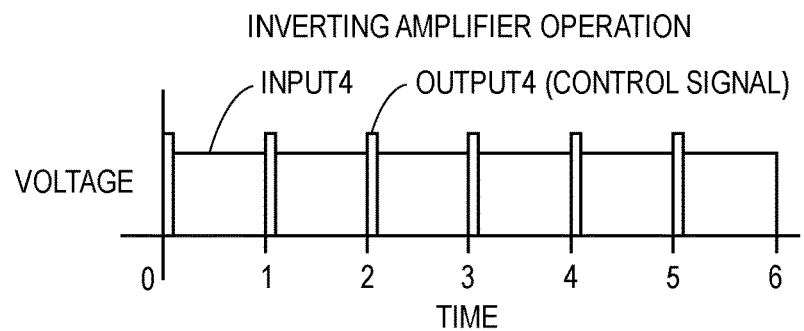
Figure 21:
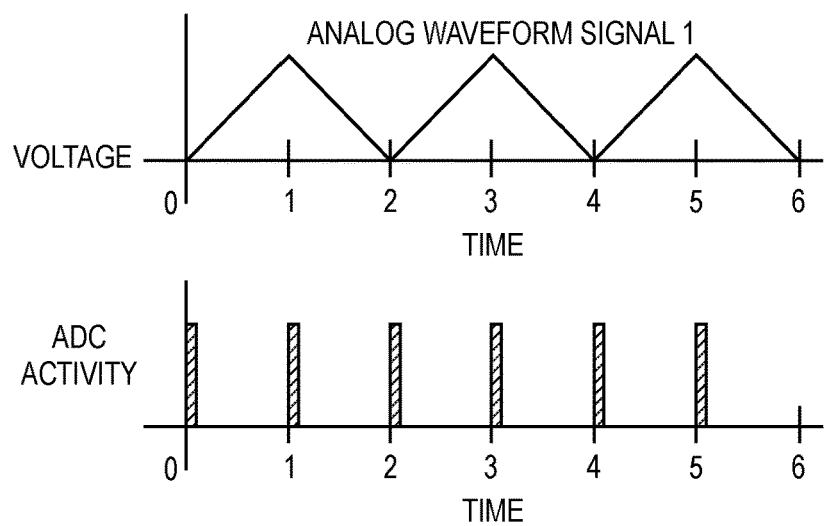
Figure 22:
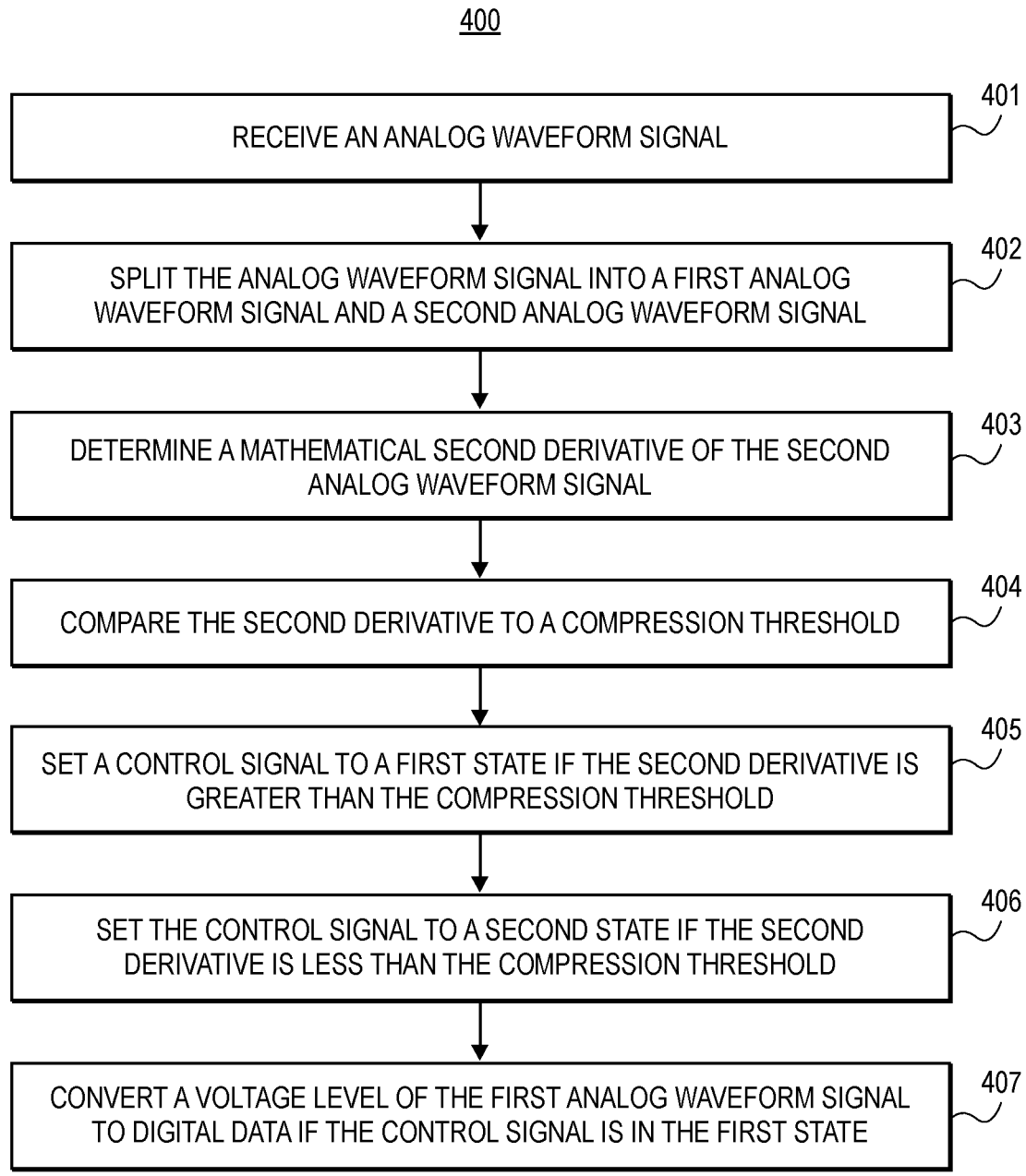

FIGS. 4A, 4B, and 4C depict a flow chart of an algorithm for compressing sampled data; and FIG. 5 is a depiction of an inputamplitude array, configured to store sampled data points, and an inputtime array, configured to store sampled times;

FIG. 6 is a depiction of a difference array, configured to store a plurality of differences, each difference being a magnitude of a change between successive adjacent pairs of sampled data points;

FIG. 7 is a depiction of an outputamplitude array, configured to store compressed data points, and an outputtime array, configured to store compressed times;

FIG. 8 is a plot of the signal vs. time of FIG. 2, depicting only the compressed data points and compressed times;

FIG. 9 is a plot of the slope vs. time for the waveform of FIG. 2;

FIG. 10 is a listing of at least a portion of the steps of a method for compressing sampled data;

FIG. 11 is a schematic block diagram of a system, constructed in accordance with other embodiments of the current invention, for compressing data as the data is sampled from an analog waveform signal, the system broadly comprising an analog splitter, an analog signal processor, and an analog to digital converter;

FIG. 12 is a schematic block diagram of the analog signal processor comprising a first derivative circuit, a second derivative circuit, a window comparator, and an inverting amplifier;

FIG. 13 is a schematic block diagram of the first and second derivative circuits;

FIG. 14 is a plot of voltage vs. time for an analog waveform signal;

FIG. 15 is a plot of voltage vs. time for a first derivative of the analog waveform signal;

FIG. 16 is a plot of voltage vs. time for a second derivative of the analog waveform signal;

FIG. 17 is a schematic block diagram of the window comparator;

FIG. 18 is a plot of voltage vs. time for the operation of the window comparator;

FIG. 19 is a schematic block diagram of the inverting amplifier;

FIG. 20 is a plot of voltage vs. time for the operation of the inverting amplifier;

FIG. 21 is a plot of voltage vs. time for the analog waveform signal and a plot of activity vs. time for the analog to digital converter; and FIG. 22 is a listing of at least a portion of the steps of a method for compressing data as the data is sampled from an analog waveform signal.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
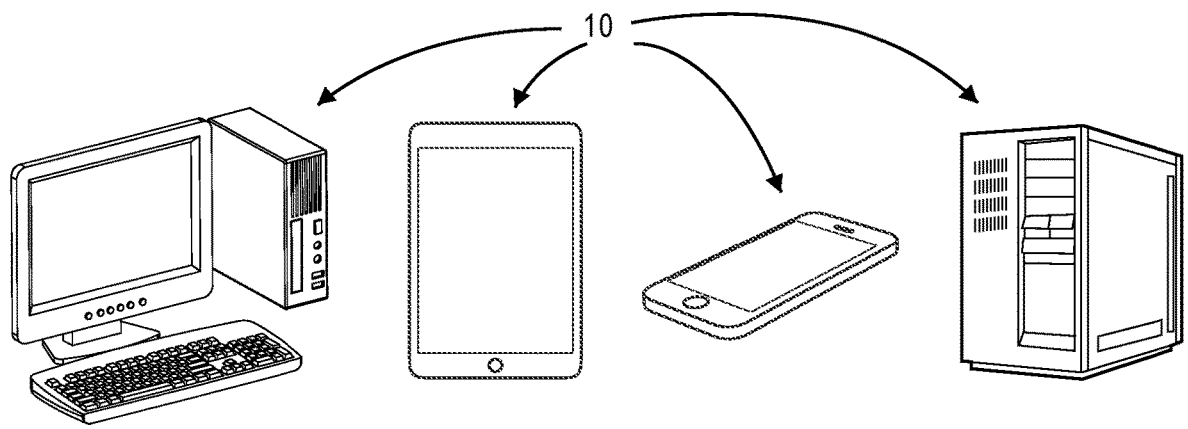
FIG. 1 is a perspective view of a plurality of electronic devices, each constructed in accordance with various embodiments of the current invention, each configured to perform compression of sampled data.

An electronic device 10 for compressing sampled data is shown constructed in accordance with various embodiments of the current invention in FIG. 1. In some instances, the electronic device 10 may be embodied by server computers, workstation computers, desktop computers, or the like which are able to receive a file of sampled data and perform compression thereon. In other instances, the electronic device 10 may be embodied by laptop computers, palmtop computers, notebook computers, tablets or tablet computers, smart phones, mobile phones, cellular phones, personal digital assistants (PDAs), smart watches or wearables, or the like which include components, such as cameras, microphones, sensors, and so forth, that are able to stream sampled data or generate a file of sampled data on which the device 10 can perform compression.

Sampling data may be illustrated in the plot of a signal, or waveform, versus time, as shown in FIG. 2. The signal may be the output of a camera, a microphone, a sensor, or the like and may represent moving or still image data, audio data, motion data, and so forth. Sampling the signal may involve capturing and recording a value of an amplitude of the signal at an instant in time, which creates a sample. The capturing and recording may occur repeatedly, typically at a constant frequency, known as the sampling rate or sampling frequency—thus, generating sampled data. In the example of FIG. 2, the samples, or sampled data points, are shown as a plurality of points, or dots, along the signal and are labeled Sn, where n is an index number ranging from 0 to 20. This range is merely exemplary. In practical situations, the range of samples may be orders of magnitude greater. Each sample is taken at a time point, labeled tn, where n is the same index as is used for the samples. The sampled data may form an array with n elements having values S0 to Sn−1.

Compressing the sampled data, in general, produces an output array of data, compressed data, that includes fewer elements than the array of sampled data. The compressed data (and the compression process) may be lossless, which means that the original signal, from which the sampled data was taken, can be reconstructed perfectly using linear interpolation. Alternatively, the compressed data (and the compression process) may be lossy, which means that the original signal cannot be reconstructed perfectly because some of the sampled data was lost or purposely discarded in an attempt to achieve further compression.

Figure 3:
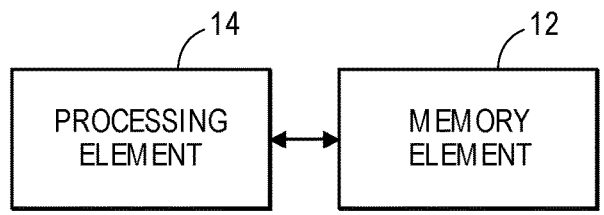
FIG. 3 is a schematic block diagram of various components of one electronic device.

The electronic device 10 may broadly comprise a memory element 12 and a processing element 14, as shown in FIG. 3. The electronic device 10 may further include components such as a display, a user interface including inputs such as a keyboard, a mouse, a touchscreen, or a microphone and outputs such as a speaker, a communication element allowing communication with other devices or systems, cameras, sensors, and the like which will not be discussed in detail.

The memory element 12 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 12 may be embedded in, or packaged in the same package as, the processing element 14. The memory element 12 may include, or may constitute, a non-transitory "computer-readable storage medium". The memory element 12 may store the instructions, code, code statements, code segments, software, firmware, programs, applications, apps, services, daemons, or the like that are executed by the processing element 14. The memory element 12 may also store settings, data, documents, sound files, photographs, movies, images, databases, and the like. In various embodiments, the memory element 12 may receive and store sampled data.

The processing element 14 may include electronic hardware components such as processors, microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 14 may generally execute, process, or run instructions, code, code segments, code statements, software, firmware, programs, applications, apps, processes, services, daemons, or the like. The processing element 14 may also include hardware components such as finite-state machines, sequential and combinational logic, and other electronic circuits that can perform the functions necessary for the operation of the current invention. The processing element 14 may be in communication with the other electronic components through serial or parallel links that include universal busses, address busses, data busses, control lines, and the like.

The processing element 14 may be configured or programmed to perform the following functions or operations as a result of hardware, software, firmware, or combinations thereof. The processing element 14 may implement an algorithm 100 for compressing sampled data, as shown in the flowchart of FIGS. 4A, 4B, and 4C and explained as follows. Digitized signal data is received, as indicated in block 101. In some cases, the data may include just sampled values without any timing information, such as sampling rate or times, such as timestamps or time of day, when each sampled value was captured. In other cases, the digitized data may include sampled data values and timing data such as sampling rates or sampled data times. The digitized signal data is examined to determine the content of the data, as in decision blocks 102, 103. If the data does not include timing information, then the algorithm 100 cannot be applied, as indicated in block 104. Otherwise, if the data includes the proper information, then the data is separated into an "inputamplitude" array and an "inputtime" array, as indicated in block 105. The inputamplitude array includes values of all of the sampled data points, Sn, wherein each value is a real number representing an actual value of a physical quantity, such as electric voltage or electric current. There is one sampled data point per array element or cell, as shown in FIG. 5. The inputtime array includes all of the sampled times, tn, wherein the sampled time is a time value, such as a time of day timestamp or an offset time period from when the first sample was taken. There is one sampled time per array element or cell, as shown in FIG. 5.

As indicated in block 106, a "difference" array is created to include a change in magnitude between each subsequent pair of cells in the inputamplitude array (which are the sampled data points). The difference array may be notated as Dm or difference[m], wherein m ranges from 0 to the number of sampled data points minus one. As shown in FIG. 6, each cell of the difference array includes an absolute value of a (mathematical subtraction) difference between adjacent inputamplitude array cells. For example, within the first cell of the difference array, D0 or difference[0], is stored: |S1−S0|, which is also: |inputamplitude[1]−inputamplitude[0]|. Since the difference array includes the mathematical difference between adjacent inputamplitude array cells, the difference array will include one fewer cell than the inputamplitude array. In some embodiments, each cell of the difference array, difference[m], may be calculated as the absolute value of the difference between adjacent inputamplitude array cells divided by a difference between adjacent inputtime array cells. For example, the first cell of the difference array may be calculated as |(S1−S0)/(t1−t0)|.

Arrays "outputamplitude" and "outputtime" are created to store the compressed output data values for the amplitude and time, respectively, as indicated in block 107. The compressed output data values for the amplitude and time include the sampled data points and sampled data times, respectively, that are saved according to the rules of the algorithm 100, as discussed in more detail below.

An "allowablechange" variable is also created and assigned a value, as indicated in block 108. The allowablechange variable controls whether the algorithm 100 is lossless or lossy, and how much compression or loss occurs. For example, the data compression of the algorithm 100 is lossless when allowablechange=0. The data compression of the algorithm 100 is lossy when allowablechange >0. Generally, the greater the value of allowablechange, the more lossy the data compression. During implementation of the algorithm 100, the allowablechange variable acts as a constant and maintains its value throughout execution, but it may change value from the compression of one sampled data set to the next. In some embodiments, the user may be able to choose the value of the allowablechange variable in order to control the performance of the algorithm 100. Variables "lastdifference", "localdifference", "inputindex", and "outputindex" are created as indicated in block 109. lastdifference stores a value of the most recent cell from the difference array while the algorithm 100 sequentially retrieves the value of each cell of the difference array, as discussed in more detail below. localdifference stores a difference in magnitude between sequentially retrieved values of cells of the difference array and lastdifference. inputindex is a pointer that points to a current cell of the inputamplitude array. outputindex is pointer that points to a current cell of the outputamplitude array.

The values from the first two cells of the inputamplitude array are stored into the first two cells of the outputamplitude array, as indicated in block 110. This is a default step to store the first two sampled data points. outputindex is initialized to a value of 2 and inputindex is initialized to a value of 1, as indicated in blocks 111, 112. lastdifference is also initialized to have to the first value of the difference array, as indicated in block 113.

localdifference is set to be equal to an absolute value of a difference between the value of the difference array cell pointed to by inputindex and lastdifference, as indicated in block 114. The step of block 114 may mark the beginning of a loop of steps that are performed repeatedly. The number of times that the loop of steps may be performed is equal to the number of cells in the difference array minus 1.

The sampled data points may be considered to form a plurality of segments in sequential order, wherein each segment is a line between successive adjacent pairs of sampled data points. For example, a first segment may be a line between the first and second sampled data points, a second segment may be a line between the second and third sampled data points, and so forth. The slope of each segment may be a difference in its y-values divided by a difference in its x-values. Given that each segment has the same difference in its x-values, the slope then may be considered just the change in its y-values, which is the difference in sampled data points, or what is stored in each cell of the difference array. Since lastdifference stores the value of the most recent difference array cell, the step of block 114 calculates the magnitude of the change in slope from segment to segment, wherein the change is stored in localdifference. For example, the first time the step of block 114 is performed, inputindex=1 and lastdifference=D0. Thus, localdifference=|D1−D0|. In other words, the first time through, localdifference equals the magnitude of the change in slope from the first segment to the second segment.

localdifference is compared to allowablechange to determine if localdifference is greater than allowablechange, as indicated in decision block 115. The step of block 115 determines whether compression is performed, wherein compression is the discarding of the current sampled data point from being stored in the outputamplitude array, which is the compressed data set. The current sampled data point is the second point of the first segment, which is also the first point of the second segment in the comparison. If localdifference (the amount of change in the slope of the last two segments) is less than or equal to allowablechange, then compression is performed and the current sampled data point is not stored in the outputamplitude array. In other words, if the slope of the segments is not changing much at the current sampled data point, then there is no need to save the current sampled data point. And, the flow of the algorithm 100 is from block 115 to block 120.

On the other hand, if localdifference is greater than allowablechange, then compression is not performed and the current sampled data point is stored in the outputamplitude array. In other words, if the slope of the segments is changing significantly at the current sampled data point, then the current sampled data point should be saved. And, the algorithm 100 flows to block 116, in which the current sampled data point, inputamplitude[inputindex], is saved in the compressed data set, outputamplitude[outputindex]. To continue the example above regarding the first time the steps of blocks 115 and 116 are performed, localdifference, which is |D1−D0|, is compared with allowablechange. This comparison involves the sampled data points S0, S1, S2, and determines whether the slope of the segments formed by the points changes significantly at S1. If so, sampled data point S1 is saved. If not, then sampled data point S1 is not saved.

In addition, the current sampled time point, inputtime[inputindex], is saved in the compressed time set, outputtime[outputindex], as indicated in block 117. Furthermore, lastdifference is updated with the current value from the difference array, difference[inputindex], as indicated in block 118. outputindex is incremented, as indicated in block 119, since a sampled data point was saved in the compressed data set.

inputindex is incremented, as indicated in block 120. This step is performed either after the step of block 119 or after the step of block 115 if localdifference is not greater than allowablechange. Thus, inputindex is incremented whether or not compression was performed on the current sampled data point.

inputindex is checked to determine if it is equal to the number of difference array elements, as indicated in decision block 121. If not, then the loop of steps from blocks 114-120 continues, and the flow of the algorithm 100 returns to the step of block 114. If so, then the loop of steps from blocks 114-120 is complete, and the flow proceeds to the step of decision block 122, wherein the last element of the outputtime array is checked to determine if it is equal to the last element of the inputtime array. If so, then the algorithm 100 is complete. If not, then the last sampled data point, inputamplitude[last element], is stored in the compressed data set, outputamplitude[last element], as indicated in block 123. And, the last sampled time point, inputtime[last element], is stored in the compressed time set, outputtime[last element], as indicated in block 124. After the step of block 124, the algorithm 100 is complete.

As an example of its operation, the algorithm 100 was applied to a sampled data set created by sampling the signal shown in FIG. 2. The compressed data set and the compressed time set, which are the outputamplitude array and the outputtime array, respectively, are shown in FIG. 7. And, the compressed data points plotted on the original signal are shown in FIG. 8. As can be seen in FIG. 8, the first two sampled data points, S0, S1, were saved, as indicated in the step of block 110. The other sampled data points, S4, S8, S12, and S16, that were saved as compressed data were the data points at which the slope of the segments changed significantly, i.e., the slope change was greater than allowablechange. Finally, the last sampled data point was saved as compressed data, as indicated in the step of blocks 123, 124.

The processing element 14 may also be configured or programmed to perform the following functions or operations. The processing element 14 receives a plurality of sampled data points, e.g., S0–Sn−1, and a plurality of sampled times, e.g., t0–tn−1. Each sampled time is associated with a successive sampled data point. The processing element 14 calculates a slope, which may also be considered a first derivative, for each of the sampled data points in succession, wherein the slope is a value of change between the sampled data point and its successive sampled data point. For example, a slope for the first sampled data point, S0, is calculated as the second sampled data point, S1, minus the first sampled data point, S0: (S1−S0), i.e., for sampled data points that were sampled at a constant sampling frequency. A plot of the slope of the exemplary waveform of FIG. 2 versus time is shown in FIG. 9. In general, or for sampled data points that were sampled with a variable sampling frequency, a slope for the first sampled data point, S0, is calculated as a difference between a value of the successive sampled data point, S1, and a value of a current sampled data point, S0, divided by a difference between a value of the sampled time, t1, associated with the successive sampled data point, S1, and a value of the sampled time, t0, associated with the current sampled data point, S0: (S1−S0)/(t1−t0). The processing element 14 tracks, or stores, at least temporarily, the currently-calculated slope and the previously-calculated slope. For example, when calculating the slope for the second (current) sampled data point, S1, the processing element 14 also has stored and has access to the slope calculated for the first (previous) sampled data point, S0. The processing element 14 may also calculate a change in the slope as a current slope minus a previous slope, or a difference between the two slopes. When the slope changes from the previous-sampled data point to the current-sampled data point—meaning that the difference between the two slopes is not zero—the processing element 14 stores the current-sampled data point in the memory element 12. The processing element 14 may also store the sampled time associated with the current-sampled data point.

The processing element 14 continues the process of calculating a slope for each sampled data point and calculating a difference between the current slope and the previous slope. When the difference is not zero, the processing element 14 stores the current-sampled data point. In other words, wherever the slope changes value, the data point at which the change occurs is stored. From the plot of the slope in FIG. 9, it is seen that the slope changes value at the data points at the following times: t4, t8, t12, and t16. So, the data points at those times are stored in the memory element 12. When the processing element 14 comes to the last sampled data point, it does not perform the calculations, but instead simply stores the last sampled data point and its sampled time. In various embodiments, the processing element 14 may store the first two sampled data points and their associated sampled times automatically.

FIG. 10 depicts a listing of at least a portion of the steps of an exemplary computer-implemented method 200 for compressing sampled data. The steps may be performed in the order shown in FIG. 10, or they may be performed in a different order. Furthermore, some steps may be performed concurrently as opposed to sequentially. In addition, some steps may be optional or may not be performed. The steps may be performed by the processing element 14 of the electronic device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 201, a plurality of sampled data points and a plurality of sampled times are received. Each sampled data point may be the result of capturing and recording a value of an amplitude of a signal at an instant in time, which is the associated sampled time. Exemplary sampled data points are shown in FIG. 2 and are labeled as S0-S20. Also shown are sampled data times, labeled as t0-t20, wherein t0 is associated with S0, t1 is associated with S1, and so forth. Typically, the sampled data point is a real number representing an actual value of a physical quantity, such as electric voltage or electric current. The sampled time may include a time stamp, such as time of day, an offset time period from when the first sampled data point was captured, or the like Referring to step 202, the first two sampled data points, S0, S1, and the last sampled data point, Sn−1, are stored in the memory element 12. The first two sampled data points and the last sampled data point may be ignored by the operations of the subsequent steps, and thus, may be stored by default. The first two and last sampled times are stored in the memory element 12 as well.

Referring to step 203, a plurality of differences is calculated, wherein each difference is a magnitude of a change between successive adjacent, or consecutive, pairs of sampled data points. Each difference, notated as Dm, wherein m ranges from 0 to the number of sampled data points minus one, may be calculated by subtracting one sampled data point from another sampled data point and determining an absolute value of the result. For example, a first difference, D0, may be calculated as: |S1−S0|. A second difference, D1, may be calculated as: |S2−S1|, and so forth.

Referring to step 204, a plurality of difference changes is calculated, wherein each difference change a magnitude of a change between successive adjacent, or consecutive, pairs of differences. Each difference change, notated as DCx, wherein x ranges from 0 to the number of differences minus one, may be calculated by subtracting one difference from another difference and determining an absolute value of the result. For example, a first difference change, DC0, may be calculated as: |D1−D0|. A second difference change, DC1, may be calculated as: |D2−D1|, and so forth. In addition, each difference change is associated with successive groups of sampled data points, with each group including three sampled data points. The three sampled data points are three consecutive sampled data points that are used to determine two consecutive differences. For example, the first difference, D0, is determined from S1 and S0, while the second difference, D1, is determined from S2 and S1. Thus, the three consecutive data points are S0, S1, and S2. Since the first difference change, DC0, is determined from D1 and D0, the first difference change is associated with the group of sampled data points comprising S0, S1, and S2. Following the same reasoning, the second difference change, DC1, is associated with the group of sampled data points comprising S1, S2, and S3, and so forth.

The group of three consecutive sampled data points associated with each difference change is also the three points that form the first and second segments of the setup and comparison of blocks 114 and 115 of the algorithm 100 discussed above. Furthermore, the difference change is the same value and calculated in a similar way as the magnitude of the change of slope from the first segment to the second segment.

Referring to step 205, each difference change is compared to a threshold. The threshold controls whether the compression of the sampled data is lossless or lossy, and how much compression or loss occurs. For example, the data compression is lossless when the threshold=0. The data compression is lossy when the threshold >0. Generally, the greater the value of the threshold, the more lossy the data compression.

Referring to step 206, for each difference change that is greater than the threshold, a second sampled data point of the group associated with the difference change is stored in the memory element 12. The sampled time associated with the sampled data point is also stored in the memory element 12. As discussed above for step 204, the group of sampled data points associated with each difference change includes three consecutive sampled data points. The second sampled data point is the middle of the three, or the second ordinal point. For example, the first difference change, DC0, includes sampled data points S0, S1, and S2. The second sampled data point is S1. The second difference change, DC1, includes sampled data points comprising S1, S2, and S3. The second sampled data point is S2, and so forth.

The second sampled data point is also the current sampled data point discussed above with reference to blocks 115 and 116 of the algorithm 100, wherein the determination is made as to whether the change in slope between the first and second segments (localdifference) is greater than the threshold (allowablechange). If so, then the current sampled data point is saved. If not, then the current sampled data point is discarded. Like the current sampled data point of the algorithm 100, the second sampled data point of the method 200 is the point under consideration when the determination is made as to whether data compression is performed and the point is discarded or data compression is not performed and the data point is saved. Thus, all of the second sampled data points that are stored in the memory element 12 form the compressed data set.

Referring to FIGS. 11-21, another embodiment of the current invention provides a system 300 for compressing data as the data is sampled from an analog waveform signal. The system 300 broadly comprises an analog splitter 302, an analog to digital converter (ADC) 304, and an analog signal processor 306. In the following description, the word "voltage" may be used to describe electric voltage, the word "current" may be used to describe electric current, and the word "power" may be used to describe electric power. In addition, the word "signal" may be used to describe an electromagnetic wave conducted through an electrically conductive medium in which a voltage, a current, and/or a power varies, or may be constant, over time.

The system 300 receives an analog waveform signal, such as an audio signal, a video signal, a sensor signal, or the like, and splits the signal into two signals. One signal is communicated to the ADC 304, whose operation is gated. That is, the ADC 304 converts an analog signal to digital data only when it receives a control signal from the analog signal processor 306. The other signal is communicated to the analog signal processor 306 which analyzes the changes in the level of the voltage, or other electric property or characteristic, and compares an output, which varies according to a second derivative of the signal, to a predetermined compression threshold. The compression threshold may be selected or adjusted by a user using the system 300 to compress data. The compression threshold determines the amount of compression of the data, or lossiness of the compression. Generally, the larger the value of the compression threshold, the greater the compression. Larger values of the compression threshold result in more lossy compression. The smaller the value of the compression threshold, the less the compression. Smaller values of the compression threshold result in less lossy compression. A value of zero for the compression threshold results in lossless compression.

When the output is above the compression threshold, the analog signal processor 306 asserts, activates, or places the control signal in a first state. When output is less than or equal to the compression threshold, the analog signal processor 306 deasserts, deactivates, or places the control signal in a second state. Thus, the ADC 304 converts the waveform to digital data only when the waveform changes, or "accelerates", significantly. Otherwise, the portions of the waveform that do not change very much over time are discarded—resulting in compression of the waveform signal.

The analog splitter 302 generally splits the analog waveform signal input into a first analog waveform signal and a second analog waveform signal such that a power of the input signal is divided by two for each output signal. Thus, a voltage for each of the first and second analog waveform signals is typically the same as the voltage for the input analog waveform signal, while a current for each of the first and second analog waveform signals is typically one half of the current for the input analog waveform signal.

The ADC 304 generally converts the first analog waveform signal to digital data. The ADC 304 may include one of a plurality of electronic circuit architectures, such as direct conversion, successive approximation, ramp compare, Wilkinson, integrating, and so forth. The ADC 304 samples a level of the voltage of the first analog waveform signal periodically and for each sample, converts the level to a number corresponding to the level of the voltage such that the number is expressed in digital data form. The ADC 304 may output the digital data in a parallel format with a plurality of individual lines, each providing one bit of data, or in a serial format with a single line providing a stream of bits of data. Furthermore, the ADC 304 includes an enable input 308, which receives a binary electronic signal. In a first state in which the signal is asserted or activated, the ADC 304 operates normally. In a second state in which the signal is deasserted or deactivated, the ADC 304 does not convert the first analog waveform signal to digital data.

Referring to FIG. 12, the analog signal processor 306 generally controls the operation of the ADC 304 and broadly comprises a first derivative circuit 310, a second derivative circuit 312, a window comparator 314, and an inverting amplifier 316.

Referring to FIG. 13, the first derivative circuit 310 generates a first output signal which varies according to a mathematical derivative of a first input signal, which is the second analog waveform signal. An exemplary first derivative circuit 310 includes a first capacitor 318, a first resistor 320, and a first operational amplifier (opamp) 322. Other electric circuit topologies that generate a signal, or electrical property or characteristic, that varies according to a first derivative of an input signal are possible. The first capacitor 318, the first resistor 320, and the first opamp 322 are each known electronic components that function as expected. Given that the positive input of the first opamp 322 is electrically connected to electrical ground, the first capacitor 318 is electrically connected to the negative input of the first opamp 322, and the first resistor 320 is electrically connected to feed back the output of the first opamp 322 to the negative input, the circuit is configured as an inverting differentiator. That is, the output voltage varies according to a derivative of the input voltage:

$$V_{out} = -R1C1\frac{dV_{in}}{dt}$$

The second derivative circuit 312 includes a second capacitor 324, a second resistor 326, and a second opamp 328, each of which is roughly identical to, and electrically connected to one another in the same manner as, the like-named components of the first derivative circuit 310. Since the (second) input of the second derivative circuit 312 is the output of the first derivative circuit 310, and the second derivative circuit also generates an output signal which varies according to a mathematical derivative of an input signal, the second derivative circuit 312 generates a second output signal which varies according to the derivative of the derivative of the second input signal, or the mathematical second derivative of the first input signal, which is the second analog waveform signal.

Referring to FIGS. 14-16, the operation of the first and second derivative circuits 310, 312 is shown. In FIG. 14, a plot of voltage vs. time is shown for input1, which is the input of the first derivative circuit 310 and receives the second analog waveform signal. As an example, the second analog waveform signal is a triangle wave. In FIG. 15, a plot of voltage vs. time is shown for the first output signal voltage, which is the output of the first derivative circuit 310. Continuing the example, the first output signal voltage varies according to derivative of a triangle wave, which is a square wave. But, since the first derivative circuit 310 is an inverting differentiator, the plotted square wave is the negative of the mathematical derivative. In FIG. 16, a plot of voltage vs. time is shown for the second output signal voltage, which is the output of the second derivative circuit 312. Continuing the example, the second output signal voltage varies according to the derivative of the square wave, which is a sequence of impulses—which is also the second derivative of the triangle wave of the exemplary second analog waveform signal.

The window comparator 314 generates a third output signal that is asserted when a third input signal has a value within a predetermined range of values. The window comparator 314 includes a first resistor 330, a second resistor 332, a third resistor 334, a fourth resistor 336, a first opamp 338, a second opamp 340, and a voltage offset circuit 342. The first resistor 330, the second resistor 332, the third resistor 334, the fourth resistor 336, the first opamp 338, and the second opamp 340 are each known electronic components that function as expected. The first opamp 338 and the second opamp 340 are each configured as single-rail voltage comparators such that the output of each opamp 338, 340 is driven to a positive voltage when the voltage of the positive input is greater than the voltage of the negative input and the output of each opamp 338, 340 is driven to a electrical ground (0V) when the voltage of the negative input is greater than the voltage of the positive input. The fourth resistor 336 electrically connects the outputs of the first opamp 338 and the second opamp 340 to a pull up voltage, which sets a level of the positive voltage of the outputs.

The first resistor 330, the second resistor 332, and the third resistor 334 are electrically connected in series with one another between a voltage supply (Vcc) and electrical ground to form a voltage divider network. The first resistor 330 and the second resistor 332 are each electrically connected to the positive input of the first opamp 338 to set a high voltage (Vh). The second resistor 332 and the third resistor 334 are each electrically connected to the negative input of the second opamp 340 to set a low voltage (Vl). In some embodiments, the first resistor 330, the second resistor 332, and the third resistor 334 may each be variable resistors whose resistance value can be selectively adjusted in order to adjust the values of Vh and Vl. The configuration of the first resistor 330, the second resistor 332, the third resistor 334, the first opamp 338, and the second opamp 340 creates a voltage "window" between Vh and Vl to which the voltages of the negative input of the first opamp 338 and the positive input of the second opamp 340 are compared.

The voltage offset circuit 342 generally provides a positive direct current (DC) offset voltage, or level shift, to the input signal. The amount of the offset voltage may be determined by a reference voltage (Vref). Typically, the level of the offset voltage is set to roughly a center of the voltage window, that is, (Vh−Vl)/2. The voltage offset circuit 342 is electrically connected to the third input, and both are electrically connected to the negative input of the first opamp 338 and the positive input of the second opamp 340. Thus, the offset voltage is received by the negative input of the first opamp 338 and the positive input of the second opamp 340.

Referring to FIG. 18, a plot of voltage vs. time for Vh, Vl, the third input signal voltage, the offset voltage, and the third output signal voltage is shown to illustrate the operation of the window comparator 314. The high voltage Vh and the low voltage Vl are shown as dashed lines and the level of each is typically constant, although the level may be selectively adjusted by a user or by other system parameters. The third input signal voltage is received from the second output (output2) of the second derivative circuit 312. Continuing the example from above, the third input signal voltage has an exemplary waveform of a sequence alternating positive and negative impulses. The impulses from the output of the second derivative circuit 312 are centered at 0 V. In order to be properly detected by the window comparator 314, the output of the second derivative circuit 312 is raised by the voltage offset circuit 342 to the offset voltage such that the impulses are centered in roughly the center of the voltage window between Vh and Vl.

At time t=0, the level of the positive impulse of the offset voltage is greater than Vh, so the third output signal voltage remains low (approximately 0 V). As time goes by and the offset voltage decreases from the maximum level of the positive impulse, the offset voltage becomes less than Vh, but still greater than Vl, meaning that the offset voltage is within the voltage window—resulting in the third output signal voltage rising to a high level.

At time t=1, the negative impulse occurs, resulting in the offset voltage being less than Vl, which lowers the third output signal voltage to the low level. As time goes by and the offset voltage rises from the minimum level of the negative impulse, the offset voltage becomes greater than Vl, but still less than Vh, meaning that the offset voltage is within the voltage window—resulting in the third output signal voltage rising to a high level.

The operation of the window comparator 314 occurring between times t=0 through t=2 repeats as the sequence of impulses from the second derivative circuit 312 repeats. For all the time that the level of the offset voltage is within the voltage window between Vh and Vl, the third output signal voltage remains at the high level. For all the time that the level of the offset voltage is outside of the voltage window between Vh and Vl, the third output signal voltage remains at the low level. Thus, the window comparator 314 not only detects when the level of the offset is within a certain range, i.e., the voltage window, but the window comparator 314 also detects when the level of the offset is outside of the range. The third input signal normally swings into both positive voltage and negative voltage. However, since the third input signal voltage is offset, or shifted, by a positive DC offset (from the voltage offset circuit 342), this allows the window comparator 314 to determine when an absolute value of the input signal is greater than the compression threshold—the compression threshold varying according to, or being proportional to, (Vh−Vl)/2. That is, the third output signal of the window comparator 314 remains at a low voltage when the absolute value of the third input signal is greater than the compression threshold. Thus, the third output signal is logically, or functionally, the same as the control signal.

In other embodiments, the window comparator 314 may have a slightly different architecture. The first opamp 338 and the second opamp 340 may be configured as dual-rail voltage comparators that are each electrically connected to a positive voltage supply (+Vcc) and a negative voltage supply (−Vcc). Furthermore, the third resistor 334 is electrically connected to a negative voltage supply (−Vcc) instead of electrical ground. With this configuration, the voltage window may be centered at 0 V, such that the high voltage Vh has a positive voltage value, for example, +1.5 V, and the low voltage Vl has a negative voltage value of the same magnitude, for example, −1.5V. Also with this configuration, the voltage offset circuit 342 may not be utilized or included. Thus, the third input signal voltage (output from the second derivative circuit 312) is compared to the window voltage. If the third input signal voltage is greater than the high voltage Vh or less than the low voltage Vl, then the third output signal voltage is output to the low level. If the third input signal voltage is less than the high voltage Vh and greater than the low voltage Vl, then the third output signal voltage is output to the high level.

With the configuration of the other embodiments, in the plot of FIG. 18, there would be no "offset" waveform, and the window comparator 314 would respond directly to the input waveform, input3. In addition, the dashed line for Vh would be located on the positive voltage axis in the vicinity of the positive peaks of the input waveform, while the dashed line for Vl would be located on the negative voltage axis in the vicinity of the negative peaks of the input waveform.

The inverting amplifier 316 inverts and amplifies a fourth input signal to generate a fourth output signal, which is also the control signal. The inverting amplifier 316 includes a first resistor 344, a second resistor 346, and an opamp 348, each of which is a known electronic component that functions as expected. The components are electrically connected to one another to form an opamp-based inverting amplifier with the output voltage equal to the input voltage times −(R2/R1).

The inverting amplifier 316 is optionally included in the analog signal processor 306 depending on whether the ADC 304 is enabled with a high voltage level or a low voltage level. It is desired for the ADC 304 to be enabled when the absolute value of the second derivative of the second analog waveform signal is greater than the compression threshold. As described above, the window comparator 314 outputs a low voltage level when the absolute value of the second derivative of the second analog waveform signal is greater than the compression threshold. If the ADC 304 is enabled with a high voltage level, then the inverting amplifier 316 is included and utilized in the analog signal processor 306. If the ADC 304 is enabled with a low voltage level, then the inverting amplifier 316 is not included in the analog signal processor 306.

Referring to FIG. 20, a plot of voltage vs. time for the fourth input signal voltage and the fourth output signal voltage is shown to illustrate the operation of the inverting amplifier 316. The fourth input signal voltage is the third output signal voltage from the window comparator 314. The fourth output signal voltage is the logical inverse of the fourth input signal voltage. That is, if the fourth input signal voltage is at a low level, then the fourth output signal voltage is at a high level. And, if the fourth input signal voltage is at a high level, then the fourth output signal voltage is at a low level. (The voltage level of the fourth output signal may be controlled by the gain factor, R2/R1, of the circuit. In FIG. 20, the voltage level of the fourth output signal is drawn to be greater than the voltage level of the fourth input signal in order to easily distinguish the fourth output signal from the fourth input signal.) Thus, the inverting amplifier 316 functions like a digital logic inverter.

Referring to FIGS. 12-20, the analog signal processor 306 may operate as follows. The first derivative circuit 310 receives the second analog waveform signal and outputs the first output signal voltage which varies according to the mathematical first derivative of the second analog waveform signal. The second derivative circuit 312 receives the first output signal voltage and outputs the second output signal voltage which varies according to the mathematical second derivative of the second analog waveform signal. The window comparator 314 receives the second output signal voltage and outputs the third output signal voltage which varies according to the level of the third input signal voltage. The level of the second output signal voltage (which is the same as the third input signal voltage) is offset, or shifted by the voltage offset circuit 342 to the offset voltage. If the level of the offset voltage is outside of the voltage window between Vh and Vl, then the absolute value of the third input signal voltage (which varies according to the second derivative of the second analog waveform signal) is greater than the compression threshold (which is proportional to (Vh−Vl)/2). In this case, then the third output signal voltage is set to a first state (such as a binary logic state) or a first level, that is a low voltage level. Otherwise, when the absolute value of the third input signal voltage is less than the compression threshold, then the third output signal voltage is set to a second state (such as a binary logic state) or a second level, that is a high voltage level. The inverting amplifier 316 receives the third output signal voltage and outputs the control signal, which includes a logical inversion of the voltage levels of the states from the window comparator. Thus, the first state, which is set when the absolute value of the third input signal voltage (which varies according to the second derivative of the second analog waveform signal) is greater than the compression threshold, corresponds to a high voltage level. And the second state, which is set when the absolute value of the third input signal voltage is less than the compression threshold, corresponds to a low voltage level.

Referring to FIGS. 11-20, the system 300 may operate as follows. The analog splitter 302 receives the analog waveform signal input and outputs the first analog waveform signal and the second analog waveform signal. The voltage level of each of the first analog waveform signal and the second analog waveform signal is the same as the voltage level of the analog waveform signal input. But, typically, the current level of each of the first analog waveform signal and the second analog waveform signal is one half of the current level of the analog waveform signal input. The analog signal processor 306 receives the second analog waveform signal and determines an intermediate signal whose voltage level varies according to the second derivative of the second analog waveform signal. The analog signal processor 306 compares the intermediate signal to the compression threshold. If the voltage level of the intermediate signal is greater than the threshold, then the analog signal processor 306 outputs the control signal in the first state. If the voltage level of the intermediate signal is less than the threshold, then the analog signal processor 306 outputs the control signal in the second state. The ADC 304 receives the first analog waveform signal and the control signal. If the control signal is in the first state, then the ADC 304 converts the voltage level of the first analog waveform signal to digital data. If the control signal is in the second state, then the ADC 304 does not convert the voltage level of the first analog waveform signal to digital data.

Referring to FIG. 21, the activity of the ADC 304 in comparison to the first analog waveform signal is shown. An upper plot illustrates voltage vs. time for the first analog waveform signal. A lower plot illustrates the activity of the ADC 304 over time. Given that the exemplary waveform of the first analog waveform signal is a triangle wave, the second derivative of the first analog waveform signal exceeds the compression threshold at the "corners" of the triangle, which occur at time t=0, 1, 2, etc. The ADC 304 is active, i.e., converting the voltage level of the first analog waveform signal to digital data, for a short period at time t=0, 1, 2, etc. The activity is indicated as crosshatched areas on the lower plot.

Yet another embodiment of the current invention provides a method 400 for compressing data as it is sampled from an analog waveform signal. At least a portion of the steps of the method 400 are shown in the flow diagram in FIG. 22. The steps may be performed in the order shown in FIG. 22, or they may be performed in a different order. Furthermore, some steps may be performed concurrently as opposed to sequentially. In addition, some steps may be optional or may not be performed. The method 400 may be performed with the system 300 of FIG. 11.

Referring to step 401, an analog waveform signal is received. The analog waveform signal may be an audio signal, a video signal, a sensor signal, or the like.

Referring to step 402, the analog waveform signal is split into a first analog waveform signal and a second analog waveform signal. The analog waveform signal may be split by an analog splitter 302 which splits the analog waveform signal input into a first analog waveform signal and a second analog waveform signal such that a power of the input signal is divided by two for each output signal. Thus, a voltage for each of the first and second analog waveform signals is typically the same as the voltage for the input analog waveform signal, while a current for each of the first and second analog waveform signals is typically one half of the current for the input analog waveform signal.

Referring to step 403, a second derivative of the second analog waveform signal is determined. An analog signal processor 306 receives the second analog waveform signal. The analog signal processor 306 includes a first derivative circuit 310, a second derivative circuit 312, a window comparator 314, and an inverting amplifier 316. The first derivative circuit 310 and the second derivative circuit 312 each output a voltage signal whose level varies according to a mathematical derivative of an input signal. Since the input of the second derivative circuit 312 receives the output of the first derivative circuit 310, the output of the second derivative circuit 312 outputs a voltage signal whose level varies according to a mathematical second derivative of the first input signal. And since the first input signal is the second analog waveform signal, the second derivative circuit 312 outputs the voltage signal whose level varies according to a mathematical second derivative of the second analog waveform signal.

Referring to step 404, the second derivative is compared to a compression threshold. The output voltage signal of the second derivative circuit 312 is received by a window comparator 314. The window comparator 314 includes a resistor divider network that establishes a voltage window that is determined from, proportional to, or corresponds to, the compression threshold. The window comparator 314 offsets, or shifts, a level of the voltage of the output voltage signal of the second derivative circuit 312 so that an absolute value of the second derivative of the second analog waveform signal is compared to the voltage window by comparing the offset voltage level to a high voltage of the voltage window and a low voltage of the voltage window.

Referring to step 405, a control signal is set to a first state if the second derivative is greater than the compression threshold. The window comparator 314 outputs a signal that becomes the control signal. An inverting amplifier 316 adjusts a voltage level of the control signal, if necessary. The output voltage signal of the second derivative circuit 312, after it has been offset, or shifted, by the window comparator 314 varies according to the absolute value of the second derivative of the second analog waveform signal. If the level of the offset output voltage signal is outside of the voltage window (that is, greater than the high voltage or less than the low voltage), then the second derivative is greater than the compression threshold and the window comparator 314 sets the control signal to the first state.

Referring to step 406, a control signal is set to a second state if the second derivative is greater than the compression threshold. In a similar fashion to step 405, if the level of the offset output voltage signal is inside of the voltage window (that is, less than the high voltage and greater than the low voltage), then the second derivative is less than the compression threshold and the window comparator 314 sets the control signal to the second state.

Referring to step 407, a voltage level of the first analog waveform signal is converted to digital data if the control signal is in the first state. The voltage level of the first analog waveform signal is converted to digital data because the second derivative of the first analog waveform signal was greater than the compression threshold, which means that portion of the waveform should be converted to digital data that can be saved. Otherwise, if the control signal is in the second state, then the first analog waveform signal is not converted to digital data—resulting in compression of the first analog waveform signal.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

The invention claimed is:

1. A system for compressing data as the data is sampled from an analog waveform signal, the system comprising:
   an analog splitter configured to receive the analog waveform signal and output a first analog waveform signal and a second analog waveform signal;
   an analog signal processor configured to receive the second analog waveform signal, determine a second derivative of the second analog waveform signal, and output a control signal in a first state when the second derivative is greater than a compression threshold; and
an analog to digital converter configured to receive the first analog waveform signal and the control signal and convert a voltage level of the first analog waveform signal to digital data when the control signal is in the first state.

2. The system of claim 1, wherein the analog signal processor is further configured to output the control signal in a second state when the second derivative is less than the compression threshold and the analog to digital converter is further configured to not convert the first analog waveform signal to digital data when the control signal is in the second state.

3. The system of claim 1, wherein the analog signal processor comprises:
a first derivative circuit configured to receive the second analog waveform signal and output a first output signal with a voltage level that varies according to a mathematical first derivative of the second analog waveform signal,
a second derivative circuit configured to receive the first output signal and output a second output signal with a voltage level that varies according to a mathematical second derivative of the second analog waveform signal, and
a window comparator circuit configured to receive the second output signal compare the voltage level of the second output signal to a window voltage including a high voltage and a low voltage, and output the control signal in the first state when the voltage level of the second output signal is greater than the high voltage or less than the low voltage.

4. The system of claim 3, wherein the window comparator circuit is further configured to offset a voltage level of the second output signal to generate an offset voltage, compare the voltage level of the offset voltage to the window voltage, and output the control signal in the first state when the voltage level of the offset voltage is greater than the high voltage or less than the low voltage.

5. The system of claim 4, wherein the window comparator circuit is further configured to output the control signal in the second state when the voltage level of the second output signal is less than the high voltage and greater than the low voltage or when the voltage level of the offset voltage is less than the high voltage and greater than the low voltage.

6. The system of claim 3, further comprising an inverting amplifier configured to receive the control signal and adjust a voltage level of the control signal.

7. The system of claim 3, wherein the window voltage is determined from the compression threshold.

8. A system for compressing data as the data is sampled from an analog waveform signal, the system comprising:
an analog splitter configured to receive the analog waveform signal and output a first analog waveform signal and a second analog waveform signal;
an analog signal processor including:
a first derivative circuit configured to receive the second analog waveform signal and output a first output signal with a voltage level that varies according to a mathematical first derivative of the second analog waveform signal,
a second derivative circuit configured to receive the first output signal and output a second output signal with a voltage level that varies according to a mathematical second derivative of the second analog waveform signal, and
a window comparator circuit configured to receive the second output signal,
compare the voltage level of the second output signal to a window voltage including a high voltage and a low voltage,
output the control signal in a first state when the voltage level of the second output signal is greater than the high voltage or less than the low voltage, and
output the control signal in the second state when the voltage level of the second output signal is less than the high voltage and greater than the low voltage; and
an analog to digital converter configured to receive the first analog waveform signal and the control signal, convert a voltage level of the first analog waveform signal to digital data when the control signal is in the first state, and not convert the voltage level of the first analog waveform signal to digital data when the control signal is in the second state.

9. The system of claim 8, wherein the window comparator circuit is further configured to offset a voltage level of the second output signal to generate an offset voltage, compare the voltage level of the offset voltage to the window voltage, and output the control signal in the first state when the voltage level of the offset voltage is greater than the high voltage or less than the low voltage.

10. The system of claim 8, further comprising an inverting amplifier configured to receive the control signal and adjust a voltage level of the control signal.

11. A method for compressing data as the data is sampled from an analog waveform signal, the method comprising:
receiving an analog waveform signal;
splitting the analog waveform signal into a first analog waveform signal and a second analog waveform signal;
determining a mathematical second derivative of the second analog waveform signal;
comparing the second derivative to a compression threshold;
setting a control signal to a first state when the second derivative is greater than the compression threshold; and
converting a voltage level of the first analog waveform signal to digital data when the control signal is in the first state.

12. The method of claim 11, further comprising setting the control signal to a second state when the second derivative is less than the compression threshold.

13. The method of claim 12, further comprising not converting the voltage level of the first analog waveform signal to digital data when the control signal is in the second state.

14. The method of claim 11, wherein determining the mathematical second derivative of the second analog waveform signal includes generating a first output signal whose voltage level varies according to a mathematical first derivative of the second analog waveform signal and generating a second output signal whose voltage level varies according to a mathematical second derivative of the second analog waveform signal.

15. The method of claim 14, wherein comparing the second derivative to the compression threshold includes offsetting the voltage level of the second output signal to generate an offset signal and comparing the voltage level of the offset signal to a window voltage.

16. The method of claim 15, wherein the window voltage is determined from the compression threshold.

17. The method of claim 15, wherein the window voltage includes a high voltage and a low voltage.

18. The method of claim 17, wherein setting the control signal to the first state when the second derivative is greater than the compression threshold includes setting the control signal to the first state when the voltage level of the offset signal is greater than the high voltage or less than the low voltage.

19. The method of claim 18, further comprising setting the control signal to a second state when the voltage level of the offset signal is less than the high voltage and greater than the low voltage.

20. The method of claim 11, further comprising adjusting a voltage level of the control signal.

\* \* \* \* \*